United States Patent
Dreesen

(10) Patent No.: US 8,509,017 B2
(45) Date of Patent: Aug. 13, 2013

(54) MEMORY DEVICE AND RELATED OPERATING METHODS

(75) Inventor: Michael Dreesen, Timnath, CO (US)

(73) Assignee: Advanced Micro Devices, Inc., Austin, TX (US)

(*) Notice: Subject to any disclaimer, the term of this patent is extended or adjusted under 35 U.S.C. 154(b) by 266 days.

(21) Appl. No.: 13/028,921

(22) Filed: Feb. 16, 2011

(65) Prior Publication Data

US 2012/0206987 A1 Aug. 16, 2012

(51) Int. Cl.
*G11C 7/00* (2006.01)

(52) U.S. Cl.
USPC .......................... 365/203; 365/207; 365/205

(58) Field of Classification Search
USPC .......................................... 365/203, 207, 205
See application file for complete search history.

(56) References Cited

U.S. PATENT DOCUMENTS

| | | | |
|---|---|---|---|
| 4,625,300 A * | 11/1986 | McElroy | 365/205 |
| 6,492,844 B2 | 12/2002 | Terzioglu et al. | |
| 6,519,176 B1 | 2/2003 | Hamzaoglu et al. | |
| 7,443,715 B2 | 10/2008 | Forbes | |
| 7,447,054 B2 * | 11/2008 | Abella et al. | 365/104 |
| 7,626,871 B1 | 12/2009 | Yang et al. | |
| 7,859,926 B2 * | 12/2010 | Takami | 365/203 |
| 2008/0144367 A1 | 6/2008 | Dreesen et al. | |
| 2009/0059688 A1 | 3/2009 | Pille et al. | |
| 2010/0054065 A1 * | 3/2010 | Kajigaya | 365/205 |
| 2010/0214860 A1 | 8/2010 | Upputuri | |

* cited by examiner

*Primary Examiner* — Son Dinh
*Assistant Examiner* — Nam Nguyen
(74) *Attorney, Agent, or Firm* — Ingrassia Fisher & Lorenz, P.C.

(57) ABSTRACT

A memory device is provided that includes a memory cell, a voltage input, a plurality of bit lines, an amplifier connected to only a particular one of the bit lines, and a switch that is coupled to the amplifier and the voltage input. The switch is configured to prevent the voltage input from being electrically coupled to the amplifier when the plurality of bit lines are electrically floating.

18 Claims, 2 Drawing Sheets

MEMORY DEVICE AND RELATED OPERATING METHODS

TECHNICAL FIELD

Embodiments of the subject matter described herein relate generally to memory devices, and associated operating methods. More particularly, embodiments of the subject matter relate to memory devices that implement a single-ended read scheme and that are capable of operating in a floating bit line mode.

BACKGROUND

A random access memory (RAM) device generally includes a memory cell array. Exemplary types of random access memory (RAM) devices include, but are not limited to, static RAM (SRAM) devices and dynamic RAM (DRAM) devices. Most memory cell arrays include a plurality of unit memory cells (usually arranged in a matrix form defined by rows and columns, where each of the unit memory cells in a RAM array stores one bit of data), and peripheral circuits that control the input/output of data to/from the unit memory cells. To read data from a memory cell, one of two approaches is commonly used.

Some memory devices implement differential read schemes that use two bitlines to read data from a particular memory cell. In other words, each memory cell within a memory cell array of memory cells is read using a differential pair of bit lines, which therefore requires two bit lines per access port, per column of bits. In some differential read approaches, both bitlines are pre-charged to the same high logic voltage (Vdd), and the memory cell to be read is selected through the same wordline. The memory cell then discharges one of two bitlines depending on its content while keeping the other side high. A differential sense amplifier circuit detects the voltage difference between the two signals on the two bitlines, and latches its value.

Other memory devices implement a single-ended read scheme in which a single bitline is used to read data from a memory cell rather than using a differential pair of bit lines. In a single-ended read scheme, only one of two bitlines is actually used to perform the read operation. After a memory cell is selected via a wordline, the memory cell either holds or discharges the bitlines. A receiver circuit that includes a single-ended sense amplifier circuit is switched after the bitline voltage level drops below a threshold.

Memory devices consume significant power due to their size and the area that they occupy, and power consumption continues to be increasingly important. One technique that is commonly used to reduce power consumption of memory devices is commonly referred to as a "floating bitline" mode of operation or power-saving technique. A memory device operates in floating bit line mode when a read or write operation is not being performed. When a memory device operates in floating bit line mode, pre-charge circuits coupled to the bit lines are turned off and bit lines are left electrically floating to reduce static power consumption.

BRIEF SUMMARY OF EMBODIMENTS

When memory devices that implement a single-ended read scheme operate in floating bit line mode, one of the drawbacks is that an amplifier device (e.g., a full CMOS amplifier device) that is coupled to the one of the bit lines that is being read can continue to draw or "sink" static leakage current when the bit lines are left electrically floating in floating bit line operating mode. This can negate the value of the floating bitline power-saving technique and can accelerate the degradation of the read circuit. As such, it would be desirable to further reduce power consumption in memory devices that implement a single-ended read architecture/scheme when such memory devices are operating in a floating bit line mode.

In accordance with some of the disclosed embodiments, a memory device/system having a single-ended read architecture is provided. One implementation of the disclosed embodiments relates to a memory device that includes a memory cell, a voltage input, a plurality of bit lines, an amplifier connected to only a particular one of the bit lines, and a switch that is coupled to the amplifier and the voltage input. The memory cell can be any type of memory cell including an SRAM cell, a DRAM cell, and the like. The switch is configured to prevent the voltage input from being electrically coupled to the amplifier when the bit lines are electrically floating. This can reduce power consumption in the memory device when operating in a floating bit line mode.

In accordance with other disclosed embodiments, a method is provided for operating a memory device. The memory device comprises a memory cell, a power supply voltage input, a plurality of bit lines, pre-charge circuitry, and a single-ended sense amplifier. The pre-charge circuitry is coupled to the memory cell by the plurality of bit lines. The single-ended sense amplifier is coupled to the power supply voltage input and to one of the plurality of bit lines in a single-ended configuration. The voltage on the bit line that is coupled to the single-ended sense amplifier controls current through the single-ended sense amplifier. According to this method, during a floating bit line mode of operation when a memory access operation (e.g., a read operation or a write operation) is not taking place or is not about to take place, the plurality of bit lines are allowed to electrically float. For example, the pre-charge circuitry can be controlled to allow the plurality of bit lines to electrically float during the floating bit line mode of operation. In addition, when operating in floating bit line mode, the power supply voltage input is prevented from being electrically coupled and supplied to the single-ended sense amplifier, and possibly other portions of the memory device such as write driver circuitry.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
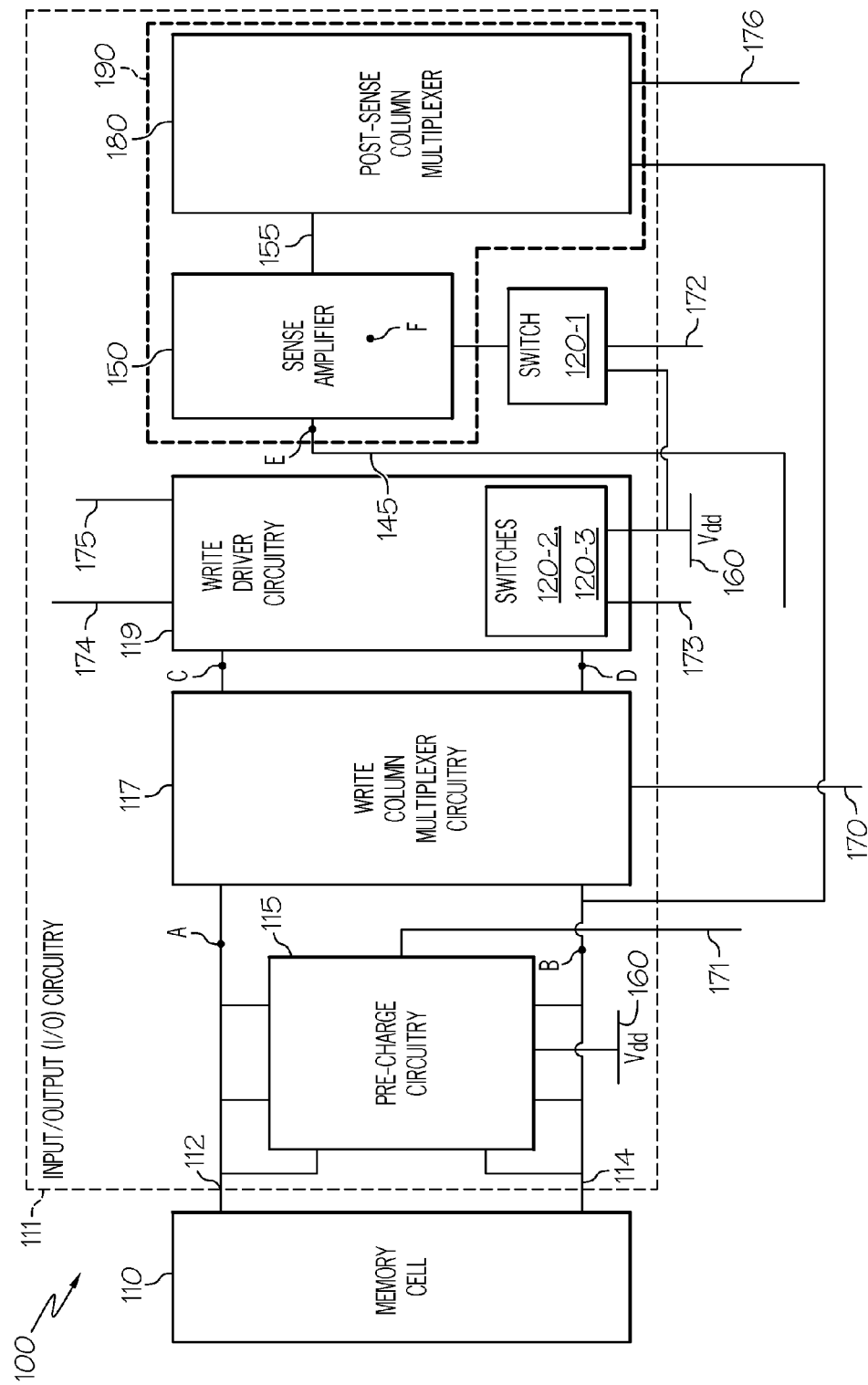
FIG. 1 is a block diagram of an exemplary memory device in accordance with some of the disclosed embodiments.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components and with reference to symbolic representations of operations, processing tasks, and functions that may be performed by various computing components or devices. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to transistor design and manufacturing, the control of memory devices, memory cell reading and writing, and other functional aspects of the devices and systems (and the individual operating components of the devices and systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically. In addition, certain terminology may also be used in the following description for the purpose of reference only, and thus are not intended to be limiting. For example, terms such as "first," "second," and other such numerical terms referring to elements or features do not imply a sequence or order unless clearly indicated by the context.

FIG. 1 is a block diagram of an exemplary memory device 100 in accordance with some of the disclosed embodiments. The memory device 100 includes a memory cell 110 that can be part of a memory cell array (not illustrated), and input/output (I/O) circuitry 111. Preliminarily, it is noted that the device 100 is configured to facilitate writing and reading of data (bits) to and from the memory cell 110. In this regard, each of the memory cells within the memory cell 110 stores the equivalent of one bit (i.e., a logic high value or state, or a logic low value or state). It is to be appreciated that the memory cell 110 could be realized in any number of different configurations, and can generally include any practical number of memory cells. In addition, the cells in the memory cell 110 may be partitioned into any number of sectors (within practical limitations).

Further, the device 100 is depicted in a simplified manner for ease of illustration, and an actual deployment of device 100 will typically include other well-known elements, logic, components, and features not shown in FIG. 1 to select cells for reading and writing operations using word lines and bit lines, as is well understood by those familiar with memory devices, and can leverage known addressing and switching techniques to select a desired target cell (or a plurality of target cells) in the memory cell 110 for writing, reading, etc.

Techniques for selecting designated word lines of the memory cell 110 as needed, and for asserting appropriate word line voltages to the selected word lines (e.g., a write voltage to support a write operation, a read voltage to support a read operation, a standby voltage to support a standby state, or the like) are well-known and therefore will not be described herein.

Likewise, techniques utilized to select designated bit lines of the memory cell 110 as needed, to assert appropriate bit line voltages to the selected bit lines (when appropriate), and to sense/detect the bit line voltages during read operations are also well-known and therefore will not be described herein.

The device 100 may also include or cooperate with at least one controller (not shown) that receives commands or instructions for invoking various processes and tasks related to writing, reading, and other operations to be described herein. Moreover, the steps of a method described in connection with the embodiments disclosed herein may be realized directly in hardware, in firmware, in a software module executed by a processor, or in any practical combination thereof. A software module may reside in RAM memory, flash memory, ROM memory, EPROM memory, EEPROM memory, registers, a hard disk, a removable disk, a CD-ROM, or any other form of storage medium known in the art.

The input/output (I/O) circuitry 111 includes pre-charge circuitry 115, column multiplexer circuitry 117, write driver circuitry 119, and a single-ended receiver 190 that is directly coupled to one of the bit lines 114 in a single-ended configuration. The single-ended receiver 190 includes a CMOS sense amplifier 150 and an NMOS column multiplexer 180. In addition, the input/output (I/O) circuitry 111 includes a number of nodes and control lines. FIG. 1 illustrates input control voltages at various ones of the control lines 170, 171, 172, 173, 174, 175 when operating the I/O circuitry 111 in a floating bitline power-saving mode (i.e., when read/write operations are not taking place), as well as the voltages at nodes labeled A-F, which are left floating when operating the I/O circuitry 111 in the floating bitline power-saving mode to reduce leakage. As will be described in detail below, this I/O circuitry 111 architecture is designed to protect any CMOS logic from floating-bitline input voltages.

The memory cell 110 can be any type of memory cell including any type of SRAM cell or any type of DRAM cell. In one implementation, the memory cell 110 can be a SRAM cell. The memory cell 110 is coupled to the pre-charge circuitry 115 and the column multiplexer circuitry 117 via memory bitlines (bit line true (BLT), bit line complement (BLC)) 112, 114 at nodes A, B, respectively.

The pre-charge circuitry 115 is controlled via a bit line pre-charge voltage applied to a bitline pre-charge complement (PCX) line 171.

In a pre-charge mode of operation, when a memory access operation (e.g., a read operation or a write operation) is about to take place, the pre-charge circuitry 115 pre-charges the memory bitlines (BLT, BLC) 112, 114 just before read/write operations take place.

By contrast, to save power when read/write operations are not taking place, the device 100 may operate in a floating bit line mode of operation. In other words, the floating bit line mode of operation can be used when a memory access operation (e.g., a read operation or a write operation) is not about to take place (or is not taking place). During this floating bit line mode of operation, the bitline pre-charge complement (PCX) line 171 is at logical one voltage so that the memory bitlines (BLT, BLC) 112, 114 are not pre-charged by the pre-charge circuitry, but are left electrically floating. By electrically floating the bitlines (BLT, BLC) 112, 114 leakage currents from the memory cell 110 can be reduced, which reduces static power consumption. As will be described below, to further reduce leakage current and static power consumption during the floating bit line mode of operation, the power supply voltage input (Vdd) 160 that is electrically coupled and supplied to various portions of the I/O circuitry 111 can be disabled and various internal nodes A-F of the I/O circuitry 111 can also be left electrically floating.

The column multiplexer circuitry 117 is coupled to the bit line (BLT) 112 (at node A), to the bit line (BLC) 114 at node B, and to the write driver circuitry 119 at nodes C, D. The column multiplexer circuitry 117 is controlled via a voltage applied to a column select (CSEL) line 170. During the floating bit line mode of operation, the column select (CSEL) line 170 is at logical zero voltage so that nodes C, D are also left floating to reduce leakage current.

The write driver circuitry 119 is controlled via voltages applied to a read enable line 173, a write data complement (WrDataC) line 174 and a write data true (WrDataT) line 175. During the floating bit line mode of operation, the write data complement (WrDataC) line 174 and write data true (WrDataT) line 175 of the write driver circuitry 119 are set to logical zero voltage.

In some embodiments, one or more switches 120-2, 120-3 are coupled between the write driver circuitry 119 and the power supply voltage input (Vdd) (160). The switches 120-2, 120-3 operate under control of and are controlled by a read enable control signal applied via read enable line 173. During the floating bit line mode of operation, the read enable line 173 is at logical one voltage and the switches 120-2, 120-3 are switch off to disable or cut offs the power supply voltage input (Vdd) 160 that would otherwise be provided to the write driver circuitry 119 to prevent the power supply voltage input (Vdd) (160) from being electrically coupled and supplied to the write driver circuitry (119), which to further reduces leakage current.

The CMOS sense amplifier 150 is directly coupled to one of the bit lines 114, and is also coupled to a switch 120-1. When the bit lines 112, 114 are electrically floating (i.e., in the floating bit line mode of operation), the switch 120-1 is configured to prevent the voltage input (Vdd) 160 from being electrically coupled to the amplifier 150. To explain further, the switch 120-1 operates under the control of a multiplexer pre-charge complement (MUXPREX) control signal 172. During the floating bit line mode of operation, the switch (120-1) can be controlled to prevent the power supply voltage input (Vdd) (160) from being electrically coupled and supplied to the CMOS sense amplifier (150). For example, in one implementation, the multiplexer pre-charge complement (MUXPREX) line 172 is at logical one voltage so that the switch 120-1 can be used to effectively disable or cut off the power supply voltage input (Vdd) 160 and prevent it from being provided to the CMOS sense amplifier 150 to further reduce leakage current during the floating bit line mode of operation. When the power supply voltage input (Vdd) 160 is not electrically coupled to (and hence not supplied to) the CMOS sense amplifier 150, this makes it safe to "float" the input voltage 145 while also floating the output 155 of the CMOS sense amplifier 150. By contrast, if the power supply voltage input (Vdd) 160 was left electrically coupled and supplied to the CMOS sense amplifier 150, a high DC current could flow through the CMOS sense amplifier 150, which would consume power and accelerate degradation of the transistors (not shown) in the CMOS sense amplifier 150.

The NMOS column multiplexer 180 is coupled to the CMOS sense amplifier 150, and receives output 155 generated by the CMOS sense amplifier 150. The NMOS column multiplexer 180 operates under control of a super bit line pulldown complement (SBLPDX) control signal 176. Because the NMOS column multiplexer 180 (or portion of the receiver 190 that is beyond the CMOS sense amplifier 150) is NMOS-only, the NMOS column multiplexer 180 of the receiver 190 can safely receive the floating output 155 of the CMOS sense amplifier 150.

Exemplary implementations of the memory device 100 will now be described with reference to FIG. 2.

Exemplary Implementation

Figure 2:
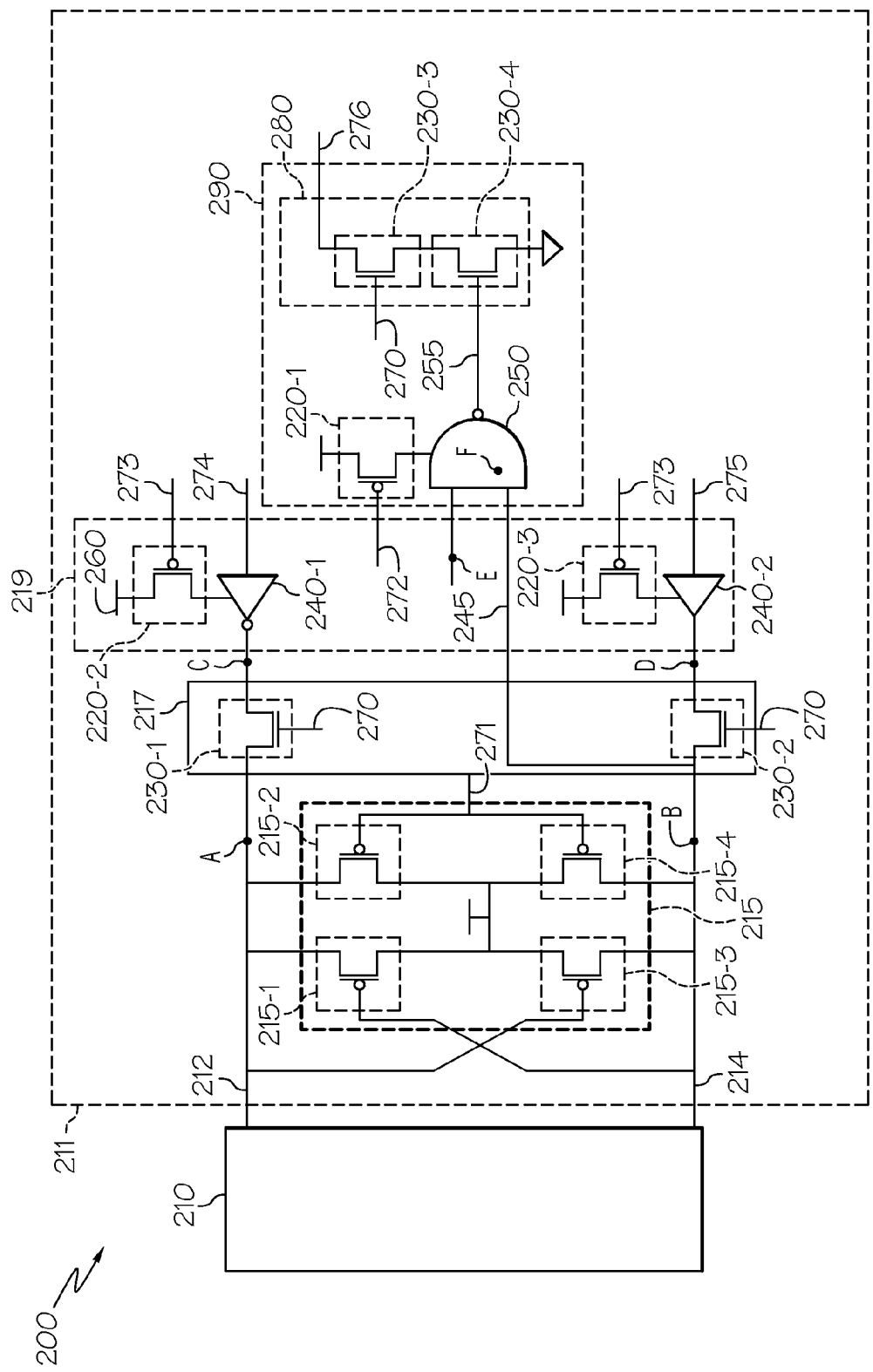
FIG. 2 is a block diagram of a memory device in accordance with one exemplary implementation of some of the disclosed embodiments.

FIG. 2 is a block diagram of a memory device 200 in accordance with some of the disclosed embodiments. The memory device 200 of FIG. 2 illustrates one non-limiting, exemplary implementation of the memory device 100 that is illustrated in FIG. 1.

The memory device 200 includes a memory cell 210, and input/output (I/O) circuitry 211. The input/output (I/O) circuitry 211 includes pre-charge circuitry 215 with cross-coupled keeper transistors, column multiplexer circuitry 217, write driver circuitry 219, and a single-ended receiver 290 that is directly coupled to one of the bit lines 214 in a single-ended configuration. The single-ended receiver 290 includes a CMOS sense amplifier 250 and an NMOS column multiplexer 280. In addition, the input/output (I/O) circuitry 211 includes a number of nodes and control lines. Of these nodes, at least nodes labeled A-F are left floating when operating the I/O circuit 211 in the floating bit line mode to reduce leakage currents. In addition, FIG. 2 also illustrates input voltages at various ones of the control lines 270, 271, 272, 273, 274, 275 when operating the I/O circuit 211 in the floating bit line mode.

The memory cell 210 can be any type of memory cell including any type of SRAM cell (e.g., 4T, 6T, 8T, 10T SRAM cell) or any type of DRAM cell. In one implementation, the memory cell 210 can be a 6T SRAM cell that includes a pair of cross-coupled inverters (implemented using four transistors) that form a latch structure, and a pair of pass transistors that act as transfer/transmission gates (and are sometimes referred to as pass gates), where the latch structure provides an architecture in which no refresh operation is required to maintain the stored data. The memory cell 210 is coupled to the pre-charge circuitry 215 and the column multiplexer circuitry 217 via memory bitlines (bit line true (BLT), bit line complement (BLC)) 212, 214 at nodes A, B, respectively.

The pre-charge circuitry 215 with cross-coupled keeper transistors 215-1, 215-3 that is illustrated in FIG. 2 shows one exemplary implementation in which two PMOS transistors 215-2, 215-4 are used to implement the pre-charge circuitry 215 along with a pair of cross-coupled keeper PMOS transistors 215-1, 215-3. As is well-known to those skilled in the art, the cross-coupled keeper PMOS transistors 215-1, 215-3 keep one bitline 212/214 high during a read or write operation when the other bitline 214/212 goes low. However, those skilled in the art will appreciate that other implementations can also be used, and for sake of brevity these implementations will not be described in detail. The pre-charge circuitry 215 is controlled via a pre-charge control voltage applied to a bitline pre-charge complement (PCX) line 271.

When the memory bitlines 212, 214 need to be pre-charged for a read or write operation, the bitline pre-charge complement (PCX) line 271 is set at logical zero voltage so that the pre-charge circuitry 215 pulls the memory bit lines (BLT, BLC) 212, 214 to a high supply voltage to pre-charge the memory bit lines (BLT, BLC) 212, 214.

By contrast, when operating in floating bit line mode, the bitline pre-charge complement (PCX) line 271 can be set at logical one voltage, and the pre-charge circuitry 215 does not pre-charge the bit lines (BLT, BLC) 212, 214 (and nodes A, B) and leaves them electrically floating to reduce leakage currents from pass gates (not illustrated) of the memory cell 210, which reduces static power consumption. For instance, in one exemplary implementation, when the memory cell 210 is an SRAM cell, because the bitlines 212, 214 are not pre-charged their voltage drops to a value determined by the ratio of pre-charger leakage to SRAM pass gate leakage. The SRAM pass gate leakage is reduced considerably due to the exponential relationship of subthreshold leakage to drain-to-source bias thus saving power.

In accordance with the implementation of the disclosed embodiments that is illustrated in FIG. 2, the column multiplexer circuitry 217 includes a pair of NMOS transistors 230-1, 230-2. NMOS transistor 230-1 is coupled to the bit line (BLT) 212 (at node A) and to the write driver circuitry 219 at node C, whereas NMOS transistor 230-2 is coupled to the bit line (BLC) 214 (at node B) and to the write driver circuitry 219 at node D. The NMOS transistors 230-1, 230-2 are controlled via a column select voltage applied to their respective gate electrodes via a column select (CSEL) line 270. The NMOS transistors 230-1, 230-2 are write column select devices that are used during the write operation to drive one bit line 212, 214 low and to hold the other bit line 214, 212 high, or vice versa. When the column multiplexer circuitry 217 is operating in floating bit line mode, the column select voltage is set at logical zero voltage via column select (CSEL) line 270, and nodes A, B, C, D are left floating to reduce leakage.

In accordance with one exemplary implementation of some of the disclosed embodiments that is illustrated in FIG. 2, the write driver circuitry 219 includes two CMOS inverters 240-1, 240-2. In one particular implementation, CMOS inverter 240-1 of the write driver circuitry 219 is coupled to the column multiplexer circuitry 217 at node C, and CMOS inverter 240-2 of the write driver circuitry 219 is coupled to the column multiplexer circuitry 217 at node D. CMOS inverter 240-1 is controlled via an input voltage applied to the write data complement (WrDataC) line 274, whereas CMOS inverter 240-1 is controlled via an input voltage applied to the write data true (WrDataT) line 275.

In the particular implementation that is illustrated in FIG. 2, each CMOS inverters 240-1, 240-2 has an optional power cut-off transistor (PMOS transistor) 220-2, 220-3 coupled thereto such that the write driver circuitry 219 comprises two tri-state write drivers 240-1/220-2, 240-2/220-3. One of the tri-state write drivers includes CMOS inverter 240-1 that is coupled to a PMOS transistor 220-2, and the other tri-state write driver includes CMOS inverter 240-2 that is coupled to a PMOS transistor 220-3. PMOS transistor 220-2 is coupled between the power supply voltage input (Vdd) and the CMOS inverter 240-1, and PMOS transistor 220-3 is coupled between the power supply voltage input (Vdd) and the CMOS inverter 240-2. When operating in the floating bit line mode (i.e., when the bit lines 212, 214 are electrically floating), to further reduce static power consumption, the write data complement (WrDataC) line 274 and write data true (WrDataT) line 275 of the write driver circuitry 219 are at logical zero voltage, and the PMOS transistors 220-2, 220-3 can be used to cut off supply voltage input (Vdd) 260 that would otherwise be electrically coupled and supplied to the CMOS inverters 240-1, 240-2, respectively. The PMOS transistors 220-2, 220-3 operate under control of a read enable control signal 273. When operating in the floating bit line mode, the read enable control signal 273 can be set at logical one voltage and thus used to disable or cut off power supply voltage (Vdd) that is supplied to the CMOS inverters 240-1, 240-2 to further reduce leakage currents.

The CMOS sense amplifier 250 can generally be any single-ended amplifier device. The CMOS sense amplifier 250 can be implemented using any CMOS device or CMOS logic gate (or combination of CMOS logic devices). In accordance with the implementation of the disclosed embodiments that are illustrated in FIG. 2, the CMOS sense amplifier 250 is implemented via a CMOS NAND gate 250; however, the CMOS sense amplifier 250 could also be implemented using any other CMOS logic device, and in one implementation can be implemented using a CMOS inverter (not shown in FIG. 2). In embodiments that employ only a single logic gate (as the CMOS sense amplifier 250) attached to the bit line 214, capacitive loading on the bit line 214 can be reduced to result in higher speed read operations, while also making the memory device 200 less sensitive to variations in memory cell 210 current that can be caused by manufacturing process variations.

The CMOS sense amplifier 250 is directly coupled to only a single bit line 214 without any intermediate multiplexer present before sensing, and therefore the CMOS sense amplifier 250 is a single-ended, pre-multiplexer sensing circuit. The voltage on bit line 214 controls current that flows through the CMOS sense amplifier 250. The CMOS sense amplifier 250 amplifies the voltage on bit line 214, and when the voltage on bit line 214 drops below a trip point of NAND gate 250, the output signal 255 is generated. However, when the I/O circuit 211 is operating in floating bit line mode and the voltage on bit line 214 (at node B) is electrically floating, the CMOS sense amplifier 250 is on and can draw a significant amount of current. Therefore a mechanism is needed to reduce leakage currents when operating in floating bit line mode.

In accordance with the disclosed embodiments, when bit line 214 is electrically floating (i.e., when operating in floating bit line mode), the supply voltage input (Vdd) 260 to the sense amplifier 250 is electrically decoupled from the CMOS sense amplifier 250 so that the CMOS sense amplifier 250 does not draw current even though the bit line 214 is electrically floating. Among other things this can reduce leakage current and static power consumption, and can also help prevent damage to the I/O circuit 211.

In one implementation, a power disable transistor (PMOS transistor) 220-1 can be coupled between the power supply (Vdd) and the CMOS NAND gate 250. The PMOS transistor 220-1 provides a mechanism to effectively disable to supply voltage input (Vdd) 260 and prevent it from being provided to the CMOS NAND gate 250. To do so, the PMOS transistor 220-1 operates under the control of a multiplexer pre-charge complement (MUXPREX) control signal 272. When read/write operations are not taking place, the multiplexer pre-charge complement (MUXPREX) line 272 can be set at logical one voltage, and supply voltage input (Vdd) that would otherwise be electrically coupled and supplied to the CMOS NAND gate 250 can be switched off to further reduce leakage. Because the power supply voltage input (Vdd) to the CMOS NAND gate 250 is effectively disabled, this makes it safe to "float" the input voltage 245 (at nodes E, F), while also floating the output 255 of the CMOS NAND gate 250. By contrast, if the power supply voltage input (Vdd) to the CMOS NAND gate 250 was not disabled and was provided to the CMOS NAND gate 250 and the input voltage 245 (at nodes E, F) was left electrically floating, the PMOS and NMOS transistors (not illustrated) that make up the CMOS NAND gate 250 would turn on and sink DC current.

The output 255 of the sense amplifier 250 can be provided to a number of different circuits. In accordance with one implementation of the disclosed embodiments that is illustrated in FIG. 2, the CMOS sense amplifier 250 can be coupled to an optional post-sense NMOS column multiplexer 280. The NMOS column multiplexer 280 is used to select a particular CMOS NAND gate 250 (from a plurality of CMOS NAND gates that are not illustrated). In this particular implementation, the NMOS column multiplexer 280 includes an NMOS domino gate 280 that includes a pair of series coupled NMOS transistors 230-3, 230-4. One of the NMOS transistors 230-4 is coupled to the CMOS NAND gate 250 and ground, and it's gate electrode receives output 255 generated by the CMOS NAND gate 250. The other NMOS transistor 230-3 of the NMOS column multiplexer 280 operates under control of a control signal applied to it's gate electrode via the column select (CSEL) line 270 and a super bit line pulldown complement (SBLPDX) control signal 276 that is applied at its source/drain. As noted above, the NMOS column multiplexer 280 can safely receive the floating output 255 of the CMOS NAND gate 250.

While at least one exemplary embodiment has been presented in the foregoing detailed description, it should be appreciated that a vast number of variations exist. For instance, in an alternative implementation of FIG. 2, the power disable transistor (PMOS transistor) 220-1 and the CMOS NAND gate 250 can be replaced with an AND-OR-INVERT (AOI) gate. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of operating a memory device that comprises a memory cell, a power supply voltage input, a plurality of bit lines directly coupled to the memory cell, pre-charge circuitry coupled to the memory cell by the plurality of bit lines, and a single-ended sense amplifier coupled to the power supply voltage input and to one of the plurality of bit lines, the method comprising:
   controlling the pre-charge circuitry to allow the plurality of bit lines to electrically float during a floating bit line mode of operation; and
   preventing the power supply voltage input from being supplied to the single-ended sense amplifier during the floating bit line mode of operation.

2. A method according to claim 1, wherein the method further comprises:
   controlling the pre-charge circuitry of the memory device to pre-charge the plurality of bit lines to prepare for a memory access operation.

3. A method according to claim 1, wherein the memory device further comprises write driver circuitry coupled to the power supply voltage input, and wherein preventing further comprises:
   preventing the power supply voltage input from being supplied to the write driver circuitry during the floating bit line mode of operation.

4. A method according to claim 3, wherein the memory device further comprises write column multiplexer circuitry coupled to the memory cell via the plurality of bitlines at a first node and a second node, and coupled to the write driver circuitry at a third node and a fourth node, and further comprising:
   electrically floating the first, second, third, and fourth nodes during the floating bit line mode of operation.

5. A method according to claim 1, wherein the single-ended sense amplifier is directly coupled to only a single bit line of the plurality of bit lines in a single-ended configuration, and wherein voltage on the single bit line controls current through the single-ended sense amplifier.

6. A memory device, comprising:
   a memory cell;
   a power supply voltage input;
   a plurality of bit lines directly coupled to the memory cell;
   pre-charge circuitry coupled to the memory cell by the plurality of bit lines, wherein the pre-charge circuitry is controllable to leave the plurality of bit lines electrically floating during a floating bit line mode of operation;
   a single-ended sense amplifier coupled to the power supply voltage input and to one of the plurality of bit lines; and
   a first switch coupled between the single-ended sense amplifier and the power supply voltage input, wherein the first switch is controllable to prevent the power supply voltage input from being electrically coupled to the single-ended sense amplifier during the floating bit line mode of operation.

7. A memory device according to claim 6, wherein the single-ended sense amplifier is directly coupled to only a single bit line of the plurality of bit lines in a single-ended configuration, and wherein voltage on the single bit line controls current through the single-ended sense amplifier.

8. A memory device according to claim 7, wherein the single-ended sense amplifier comprises a NAND logic gate.

9. A memory device according to claim 7, wherein the single-ended sense amplifier comprises a NOR logic gate.

10. A memory device according to claim 6, further comprising:
   write driver circuitry being controllable during the floating bit line mode of operation to prevent the power supply voltage input from being electrically coupled to the write driver circuitry, wherein the write driver circuitry comprises.
   a first inverter; and
   a second inverter, and
   a second switch coupled between the first inverter of the write driver circuitry and the power supply voltage input, wherein the second switch is controllable via a read enable control signal to prevent the power supply voltage input from being electrically coupled to the first inverter during the floating bit line mode of operation; and
   a third switch coupled between the second inverter of the write driver circuitry and the power supply voltage input, wherein the third switch is controllable via the read enable control signal to prevent the power supply voltage input from being electrically coupled and supplied to the second inverter during the floating bit line mode of operation.

11. A memory device according to claim 10, further comprising:
write column multiplexer circuitry coupled to the memory cell via the plurality of bitlines at a first node and a second node, wherein the write column multiplexer circuitry is coupled to the write driver circuitry at a third node and a fourth node, wherein the first, second, third, and fourth nodes are electrically floating during the floating bit line mode of operation.

12. A memory device according to claim 11, wherein the write column multiplexer circuitry comprises:
a first transistor coupled to the memory cell via one of the plurality of bitlines at the first node, and coupled to the write driver circuitry at the third node; and
a second transistor coupled to the memory cell via another one of the plurality of bitlines at the second node, and coupled to the write driver circuitry at the fourth node,
wherein the first transistor and the second transistor are controllable by a column select voltage applied to their respective gate electrodes such that the first, second, third, and fourth nodes are electrically floating during the floating bit line mode of operation.

13. A memory device according to claim 12, wherein the single-ended receiver further comprises:
a post-sense column multiplexer that is coupled to the single-ended sense amplifier to receive a floating output generated by the single-ended sense amplifier.

14. A memory device according to claim 13, wherein the single-ended sense amplifier comprises:
a single-ended CMOS sense amplifier that is directly coupled to only one of the plurality of the bit lines in a single-ended configuration; and
wherein the multiplexer comprises:
an NMOS-only post-sense column multiplexer that is coupled to the single-ended CMOS sense amplifier to receive the floating output generated by the single-ended CMOS sense amplifier.

15. A memory device according to claim 6, wherein the pre-charge circuitry is controllable via a bitline pre-charge voltage to pre-charge the plurality of bit lines when preparing for a memory access operation, or to leave the plurality of bit lines electrically floating during the floating bit line mode of operation.

16. A memory device according to claim 6, wherein the memory cell is a static random access memory (SRAM) cell.

17. A memory device according to claim 6, wherein the memory cell is a dynamic random access memory (DRAM) cell.

18. A memory device, comprising:
a memory cell;
a voltage input;
a plurality of bit lines directly coupled to the memory cell;
an amplifier directly connected to only a particular one of the bit lines; and
a switch, coupled to the amplifier and the voltage input, and being configured to prevent the voltage input from being electrically coupled to the amplifier when the plurality of bit lines are electrically floating.

* * * * *